(12) United States Patent
Li et al.

(10) Patent No.: US 9,337,823 B2
(45) Date of Patent: May 10, 2016

(54) SWITCHING CIRCUIT AND SEMICONDUCTOR INTEGRATED CIRCUIT DEVICE

(71) Applicant: HITACHI, LTD., Chiyoda-ku, Tokyo (JP)

(72) Inventors: Na Li, Tokyo (JP); Hiroyasu Yoshizawa, Tokyo (JP); Satoshi Hanazawa, Tokyo (JP); Shunsuke Kubota, Tokyo (JP); Yoshihiro Hayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/794,427

(22) Filed: Jul. 8, 2015

(65) Prior Publication Data
US 2016/0020760 A1    Jan. 21, 2016

(30) Foreign Application Priority Data
Jul. 16, 2014   (JP) ................... 2014-145587

(51) Int. Cl.
*H03K 17/00*     (2006.01)
*H03K 17/16*     (2006.01)

(52) U.S. Cl.
CPC .................... *H03K 17/161* (2013.01)

(58) Field of Classification Search
CPC ................... H03K 17/161; H03K 3/012
USPC ......... 327/403–405, 382, 374–381, 383–391, 327/365, 427, 434, 437, 337
See application file for complete search history.

(56) References Cited

U.S. PATENT DOCUMENTS

| | | | | |
|---|---|---|---|---|
| 4,473,761 A * | 9/1984 | Peterson | .......... | H03K 17/04163 327/382 |
| 4,701,732 A * | 10/1987 | Nestlerode | .............. | H03J 5/244 327/434 |
| 5,010,261 A * | 4/1991 | Steigerwald | ..... | H03K 17/04123 327/404 |
| 5,789,781 A * | 8/1998 | McKitterick | ....... | H01L 27/1203 257/347 |
| 6,163,199 A * | 12/2000 | Miske | .................. | H03K 17/162 326/113 |
| 6,552,576 B1 * | 4/2003 | Bobba | ................ | H03K 17/6874 326/113 |
| 6,759,888 B1 * | 7/2004 | Wodnicki | ........... | H03K 17/6874 323/315 |
| 7,436,237 B2 * | 10/2008 | Hikita | .................. | H03K 17/063 327/379 |

(Continued)

FOREIGN PATENT DOCUMENTS

JP      2004-363997 A     12/2004

*Primary Examiner* — Lincoln Donovan
*Assistant Examiner* — Thomas Skibinski
(74) *Attorney, Agent, or Firm* — Miles & Stockbridge P.C.

(57) ABSTRACT

Provided is a switching circuit capable of transmitting a signal with large amplitude and large current while suppressing deterioration when a small-amplitude signal is transmitted. The switching circuit 100 includes a first terminal a, a second terminal b, a first switch 1, a second switch 2, a first separation switch 3a, and a second separation switch 3b. The first switch 1 connects the first terminal a and the second terminal b according to a control signal. The second switch 2 has a first node n1 and a second node n2, and connects between the nodes in synchronization with the first switch 1. The first separation switch 3a transmits a signal of the first node n1 to the second node n2 when an electric potential of the first node n1 is higher than that of the second node n2 by more than a predetermined electric potential. The second separation switch 3b transmits a signal of the first node n1 to the second terminal b when an electric potential of the first node n1 is higher than an electric potential of the second node n2 by more than a predetermined electric potential.

8 Claims, 5 Drawing Sheets

(56) References Cited

U.S. PATENT DOCUMENTS

| | | | |
|---|---|---|---|
| 7,893,749 B2 * | 2/2011 | Honda | H03K 17/693 327/365 |
| 8,710,541 B2 * | 4/2014 | Aherne | H03K 17/6872 257/121 |
| 8,937,504 B2 * | 1/2015 | Blanken | A61N 1/36185 327/394 |

* cited by examiner

SWITCHING CIRCUIT AND SEMICONDUCTOR INTEGRATED CIRCUIT DEVICE

TECHNICAL FIELD

The present invention relates to a switching circuit, in particular, relates to a high-voltage analog switching circuit, and a semiconductor integrated circuit including a switching circuit used in an ultrasound imaging system.

BACKGROUND ART

As a high-voltage analog switching circuit, there has been known a relay circuit that applies current to a control coil to thereby generate a magnetic field in the coil, physically moves a metal plate, and connects between contact points. In addition, for example, PTL 1 indicates that a semiconductor integrated circuit consists of a switch realized by high-voltage analog circuit and a control circuit of the switch realized by semiconductor devices.

CITATION LIST

Patent Literature

PTL 1: JP 2004-363997 A

Technical Problem

A medical ultrasound imaging system includes a probe composed by a plurality of transducer elements, and makes diagnosis by contacting this probe with a human body. In this case, the medical ultrasound imaging system applies drive signals to the plurality of transducer element within the probe to drive the transducer elements and generate ultrasonic waves. Utrasonic waves reflected from inside of the body, and the transducer elements within the probe then convert them into electric signals. The converted electric signals are amplified and subjected to appropriate signal processing to be thereby imaged and displayed.

In order to make diagnosis more accurately, higher image resolution is required. In accordance with the increasing demand for higher image resolution, the number of transducer elements inside the probe has recently increased. Thus, in some cases, the number of transducer elements inside the probe exceeds the number of transducers that can be driven at the same time by a transmission/reception circuit provided in the medical ultrasound imaging system. In such cases, a high-voltage analog switching circuit for switching the connection between the transmission/reception circuit and the transducer elements is provided between the transmission/reception circuit and the plurality of transducer elements, and the switching operation of the connection between the transmission/reception circuit and the transducer elements is performed. Here, the transmission/reception circuit refers to a circuit that transmits signals for driving the transducer elements, and receives the electric signals converted by the transducer elements.

In addition, as probes used in a medical ultrasound imaging system, various probes are provided according to the diagnosis purpose. In this case, for example, the connection between transducer elements in each of a plurality of probes and the transmission/reception circuit are switched corresponding to each probe by using the high-voltage analog switching circuit.

If the relay circuit is used as the high-voltage analog switching circuit, current for generating the magnetic field in the control coil is large, which increases power consumption. In addition, the relay circuit is configured to control conduction/shutoff of a signal line by physically moving the metal plate. This causes such a problem that the relay circuit is heavy in weight and not suitable for downsizing.

PTL 1 indicates that the semiconductor integrated circuit consists of the switch and the control circuit for controlling the switch are realized by the semiconductor devices. Thus, power consumption can be reduced and the volume can be downsized in PTL 1.

Generally, the capability of transmitting amount of current in the switch formed by the semiconductor device depends on the size of the semiconductor device. In addition, a parasitic capacitance included in the semiconductor device also depends on the size of the semiconductor device, and changes in accordance with the size. When ultrasonic waves are generated in transmission period, the transmission/reception circuit outputs signals with large amplitude and large current so as to drive the transducer elements. Thus, in order to transmit the output with large amplitude and large current to the transducer elements, the semiconductor device formed switch is required to have such a size that the signals with large amplitude and large current can be conducted. In this case, as the transducer elements are driven by the large amplitude and large current, the output impedance of the transmission/reception circuit decreases. Therefore, even if a parasitic capacitance included in the semiconductor device increases due to the increased size of the semiconductor device forming the switch, the influence of the increase of the parasitic capacitance of the semiconductor device forming the switch is small.

On the other hand, when signals according to reflective waves are transmitted from the transducer elements to the transmission/reception circuit in reception period, the signals according to the reflective waves are signals with small amplitude. Thus, if the size of the semiconductor device formed switch is increased considering the transmission period, in the reception period, the signals according to the reflective waves deteriorate due to the large parasitic capacitance attached to the semiconductor device.

In other words, in the transmission period, it is desirable to increase the amount of conducting current flowing through the semiconductor device formed switch, whereas in the reception period, it is desirable to reduce the parasitic capacitance of the semiconductor device. The size of the semiconductor device is required to be set in trade-off between the increase of the amount of conducting current and the reduction of the parasitic capacitance. It is therefore difficult to optimize both of them.

PTL 1 indicates the semiconductor device formed switch, but fails to recognize that the size requirement of the semiconductor device differs between the transmission period and the reception period.

The object of the present invention is to provide a switching circuit capable of transmitting a signal with large amplitude and large current while suppressing deterioration when a small-amplitude signal is receiving.

The above and other objects and novel features of the present invention will be indicated in the description of the specification and the accompanying drawings.

Solution to Problem

Among the inventions disclosed in the present application, the following briefly describes the outline of a typical one.

More specifically, a switching circuit includes a first terminal, a second terminal, a first switch, a second switch, a first separation switch, and a second separation switch. Here, the first switch has a first node connected to the first terminal and a second node connected to the second terminal, and electrically connects the first node and the second node according to a control signal. The second switch has a first node and a second node, and electrically connects the first node and the second node in synchronization with the first switch. In addition, the first separation switch has a first node connected to the first terminal and a second node connected to the second node of the second switch, and transmits a signal in the first node to the second node when an electric potential of the first node is higher than an electric potential of the second node by more than a predetermined electric potential. Furthermore, the second separation switch has a first node and a second node, the second node is connected to the second terminal and the first node is connected to the first node of the second switch, and transmits a signal in the first node to the second node when an electric potential of the first node is higher than an electric potential of the second node by more than a predetermined electric potential.

In a period in which the first switch and the second switch are in a conductive state, a signal with high electric potential applied to the first terminal is transmitted from the first terminal to the second terminal via the first switch. In addition, in this period, since an electric potential of the first node of each of the first separation switch and the second separation switch is higher than an electric potential of the second node by more than a predetermined electric potential, a signal applied to the first terminal is transmitted to the second terminal via the first separation switch, the second switch, and the second separation switch. As a result, two signal paths connected in parallel are formed between the first terminal and the second terminal, so that the signal with high electric potential and large current can be transmitted from the first terminal to the second terminal.

In addition, in a period in which the first switch and the second switch are in the conductive state, a signal with small electric potential applied to the second terminal brings the first separation switch and the second separation switch into a non-conductive state. Thus, the second switch is electrically separated from the first terminal and the second terminal, and the signal with low electric potential supplied to the second terminal is transmitted to the first terminal via the first switch. Since the second switch is separated from the first terminal and the second terminal, parasitic capacitances attached to the first terminal and the second terminal can be reduced, so that the deterioration of the signal with small electric potential can be suppressed.

In an embodiment, the first separation switch has a first diode connected between the first node and the second node thereof, and the second separation switch has a second diode connected between the first node and the second node thereof. The predetermined electric potential in the first separation switch is the barrier voltage of the first diode, and the predetermined electric potential in the second separation switch is the barrier voltage of the second diode.

In addition, in this embodiment, the first separation switch further has a third diode connected between the first node and the second node thereof, and transmits a signal in the second node of the first separation switch to the first node of the first separation switch, when an electric potential of the second node of the first separation switch is higher than an electric potential of the first node of the first separation switch by more than the barrier voltage of the third diode. In addition, the second separation switch has a fourth diode connected between the first node and the second node thereof, and transmits a signal in the second node of the second separation switch to the first node of the second separation switch when an electric potential of the second node of the second separation switch is higher than an electric potential of the first node of the second separation switch by more than the barrier voltage of the fourth diode.

Furthermore, in this embodiment, the first separation switch and the second separation switch are conductive when a first input signal, which has amplitude larger than a signal on the second terminal, is applied to the first terminal, and the first input signal is transmitted to the second terminal via the first switch and the second switch. Each of the first separation switch and the second separation switch is non-conductive when a second input signal, which has amplitude smaller than the first input signal, is applied to the second terminal, and the second switch is electrically separated from the first terminal and the second terminal.

A first bidirectional diode is constituted by the first diode and the third diode, and a second bidirectional diode is constituted by the second diode and the fourth diode. An electric potential of each of the first input signal and the second input signal changes up and down with a predetermined voltage being set to the center.

In a period in which the first switch and the second switch are conductive, if a first input signal having amplitude larger than the barriers voltage of two diodes is applied to the first terminal, the first bidirectional diode and the second bidirectional diode are brought into the conductive state. As a result, two transmission paths are formed in parallel between a first input terminal and a second input terminal, so that a signal with large amplitude and large current can be transmitted from the first terminal to the second terminal.

On the other hand, if a second input signal having small amplitude is applied to the second terminal, each of the first separation switch and the second separation switch is non-conductive. As a result, the second switch is electrically separated from the first terminal and the second terminal. Accordingly, parasitic capacitances attached to the first terminal and the second terminal can be reduced, so that deterioration of the second input signal transmitted from the second terminal to the first terminal via the first switch can be suppressed.

Advantageous Effects of Invention

Among the inventions disclosed in the present application, the following briefly describes the effect obtained by the typical one.

There can be provided a switching circuit capable of transmitting a signal with large amplitude and large current while suppressing deterioration when a small-amplitude signal is transmitted.

DESCRIPTION OF EMBODIMENTS

Embodiments of the present invention will be described in detail below based on the drawings. In all the drawings for describing the embodiments, as a general rule, the same parts are assigned the same reference numerals, and the repetitive description thereof will be omitted in principal.

In a plurality of embodiments to be described below, the description will be given of a switching circuit used in a medical ultrasound imaging system as an example. The present invention, however, is not limited thereto since the switching circuit can be used in various electronic apparatuses. In addition, as a switching circuit, the description will be given of a switching circuit provided between transducer elements and a transmission/reception circuit in the medical ultrasound imaging system, as an example. In this case, in a transmission period, the transmission/reception circuit transmits drive signals with large amplitude and large current for driving the transducer elements. On the other hand, in the reception period, the transmission/reception circuit receives small-amplitude signals from the transducer elements. For example, in the transmission period, the transmission/reception circuit outputs drive signals having amplitude of several volts to several tens of volts up and down (plus and minus) with reference to a ground voltage. In addition, for driving the transducer elements, the transmission/reception circuit supplies, for example, a current of about 2A. On the other hand, in the reception period, the amplitude of signals supplied from the transducer elements to the transmission/reception circuit is, for example, about several tens uV to several hundreds mV.

In the reception period, signals applied to the transmission/reception circuit are analog signals. Thus, the switching circuit provided between the transducer elements and the transmission/reception circuit is a high-voltage analog switching circuit. In the following description, the high-voltage analog switching circuit will also be simply referred to as a "high-voltage switching circuit" or a "switching circuit."

First Embodiment

Figure 1:
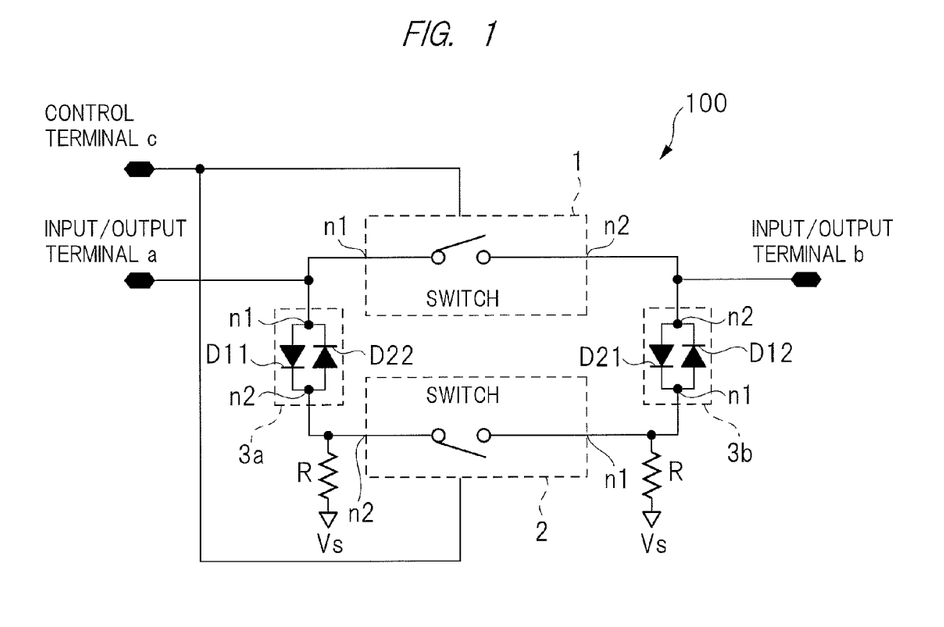
FIG. 1 is a block diagram illustrating a configuration of a switching circuit according to a first embodiment.

FIG. 1 is a block diagram illustrating a configuration of a high-voltage switching circuit according to a first embodiment. FIG. 1 illustrates a high-voltage switching circuit 100 including switches 1 and 2 and separation switches 3a and 3b. The high-voltage switching circuit 100 further includes input/output terminals a and b (first terminal and second terminal).

The switches 1 and 2 (first switch and second switch) are configured in a similar manner to each other. The switches 1 and 2 each have a node n1 and a node n2 (first node and second node). The switch 1 electrically connects between the nodes n1 and n2 controlled by a control signal (first control signal) from a control terminal c. For example, if the voltage of the control signal becomes high level, the switch 1 electrically connects between the nodes n1 and n2 to cause a conductive state. In contrast, if the voltage of the control signal becomes low level, the switch 1 electrically disconnects between the nodes n1 and n2 to cause a non-conductive state. In a similar manner to the switch 1, the switch 2 also electrically connects between the nodes n1 and n2 or causes the non-conductive state according to a control signal (second control signal) from the control terminal c. In the first embodiment, the switch 2 operates in synchronization with the switch 1. In other words, when the switch 1 electrically connects between the nodes n1 and n2 to cause the conductive state according to the control signal, the switch 2 also electrically connects between the nodes n1 and n2 to cause the conductive state. In contrast, when the switch 1 electrically disconnects between the nodes n1 and n2 to cause the non-conductive state, the switch 2 also electrically disconnects between the nodes n1 and n2 to cause the non-conductive state.

The node n1 of the switch 1 is connected to the input/output terminal a of the high-voltage switching circuit 100 while the node n2 thereof is connected to the input/output terminal b of the high-voltage switching circuit 100.

The separation switches 3a and 3b (first separation switch and second separation switch) are configured in a similar manner to each other. The separation switches 3a and 3b each have nodes n1 and n2 (first node and second node). The separation switch 3a has a diode D11 (first diode) having an anode connected to the node n1 and a cathode connected to the node n2, and a diode D22 (third diode) having a cathode connected to the node n1 and an anode connected to the node n2. In addition, the separation switch 3b has a diode D12 (second diode) having an anode connected to the node n1 and a cathode connected to the node n2, and a diode D21 (fourth diode) having a cathode connected to the node n1 and an anode connected to the node n2.

The node n1 of the separation switch 3a is connected to the input/output terminal a while the node n2 thereof is connected to the node n2 of the switch 2. In addition, the node n2 of the separation switch 3b is connected to the input/output terminal b while the node n1 thereof is connected to the node n1 of the switch 2.

In the separation switch 3a, the anode of the diode D11 and the cathode of the diode D22 are connected to the node n1 while the cathode of the diode D11 and the anode of the diode D22 are connected to the node n2. If the electric potential of the node n1 becomes higher than an electric potential of the node n2 by more than an electric potential of the barrier voltage (for example, about 0.6V) of the diode D11, the diode D11 enters the conductive state. On the other hand, if an electric potential of the node n2 becomes an electric potential higher than an electric potential of the node n1 by more than an electric potential of an electric potential barrier of the diode D22, the diode D22 enters the conductive state. In other words, the separation switch 3a can be regarded as a bidirectional diode having two barriers voltage in electric potential directions opposite to each other.

Similarly, in the separation switch 3b as well, if an electric potential of the node n1 thereof becomes higher than an electric potential of the node n2 thereof by more than an electric potential of the barrier voltage of the diode D12, the diode D12 enters the conductive state. In addition, if an electric potential of the node n2 becomes higher than an electric potential of the node n1 by more than an electric potential of the barrier voltage of the diode D21, the diode D21 enters the conductive state. Thus, the separation switch 3b can also be regarded as a bidirectional diode having two barriers voltage in electric potential directions opposite to each other.

In this manner, if an electric potential of the node n2 becomes higher than an electric potential of the node n1 by more than a predetermined electric potential (an electric potential of the barrier voltage), each of the separation switches 3a and 3b enters the conductive state. In addition, if an electric potential of the node n1 becomes higher than an electric potential of the node n2 by more than a predetermined electric potential (an electric potential of the barrier voltage), each of the separation switches 3a and 3b enters the conductive state.

On the contrary, in the separation switches 3a and 3b, if an electric potential difference between an electric potential of the node n1 and an electric potential of the node n2 is smaller than a predetermined electric potential, both of the diodes D11 and D22 (D12 and D21) enter the non-conductive state. That is, the separation switches 3a and 3b enter the non-conductive state. In other words, the separation switches 3a and 3b can be regarded as bidirectional switches with a predetermined electric potential being set as a threshold value.

If the switch 2 is brought into the conductive state, the node n2 of the separation switch 3a and the node n1 of the separation switch 3b are electrically connected via the switch 2. At this time, if an electric potential difference between the input/output terminals a and b becomes larger than an electric potential of the sum of a predetermined electric potential (threshold value) of the separation switch 3a and a predetermined electric potential (threshold value) of the separation switch 3b, each of the separation switches 3a and 3b enters the conductive state. As a result, a signal path in which the separation switch 3a, the switch 2, and the separation switch 3b are connected in series is formed between the input/output terminals a and b. At this time, since the switch 1 is also in the conductive state, a signal path by the switch 1 is formed between the input/output terminals a and b. Thus, two signal paths connected in parallel to each another is formed between the input/output terminals a and b.

For example, large-amplitude drive signals for driving the transducer elements are supplied from a transmission/reception circuit (not illustrated) to the input/output terminal a. Since the drive signals have large amplitude, the switching circuit 100 has an electric potential higher than an electric potential of the sum of the respective threshold values (electric potentials of the barriers voltage) of the separation switches 3a and 3b. This brings each of the separation switches 3a and 3b into the conductive state. If the drive signals for driving the transducer elements are supplied from the transmission/reception circuit to the input/output terminal a of the switching circuit 100, and this switching circuit 100 accordingly turns on, two signal paths are connected in parallel between the input/output terminals a and b. As a result, large current can flow between the input/output terminals a and b. In other words, it is sufficient that the large current of transmission signals required to be supplied from the transmission/reception circuit to the transducer elements can satisfy the sum of the amounts of currents that can be respectively conducted through the first and the second switches 1 and 2.

On the other hand, for example, signals from the transducer elements are supplied to the input/output terminal b of the switching circuit 100. In this case, the signals from the transducer elements are small-amplitude signals based on the reflective waves. Thus, the signals from the transducer elements that are supplied from the transducer elements to the input/output terminal b do not exceed the sum of the respective threshold values (electric potentials of the barrier voltages) of the separation switches 3a and 3b even if the second switch 2 is in the conductive state. This brings each of the separation switches 3a and 3b into a shutoff state. As a result, the switch 2 is not electrically connected to the input/output terminals a and b, and enters a separated state. In other words, if received signals are small signals smaller than the barrier voltages of the diodes D21 and D22, first and second bidirectional diodes (separation switches 3a and 3b) become electric potential barriers, and the second switch 2 is thereby shut off from the input/output terminal a and b and separated therefrom. Thus, the received signals from the transducer elements pass through only the switch 1.

The parasitic capacitance attached to the switch 2 has a capacitance value larger than those of the parasitic capacitances attached to the separation switches 3a and 3b. For example, the parasitic capacitance attached to the node n1 of the switch 2 is larger than the parasitic capacitance attached to the node n2 of the separation switch 3b. In the reception period in which the small-amplitude signals are transmitted from the input/output terminal b to the input/output terminal a, the separation switch 3b electrically separates the input/output terminal b and the switch 2 from each other. Thus, when the switching circuit 100 is seen from the input/output terminal b, the parasitic capacitance of the switching circuit 100 corresponds to the parasitic capacitance attached to the node n2 of the switch 1 and the parasitic capacitance attached to the node n2 of the separation switch 3b. The capacitance value can be therefore reduced.

In addition, at this time, since the separation switch 3a electrically separates the input/output terminal a and the switch 2 from each other, the parasitic capacitance attached to the input/output terminal a, which is connected to the input/output terminal b via the switch 1, also corresponds to the sum of the parasitic capacitance attached to the node n1 of the switch 1 and the parasitic capacitance attached to the node n1 of the separation switch 3a. This can prevent small-amplitude signals supplied to the input/output terminal b from deteriorating due to the parasitic capacitance. In this case, the small-amplitude signals (signals from the transducer elements) supplied to the input/output terminal b are transmitted to the input/output terminal a only via the switch 1.

The description has been given of the case in which large-amplitude signals are supplied to the input/output terminal a, and small-amplitude signal are supplied to the input/output terminal b. The case in which large-amplitude signals are supplied to the input/output terminal b, and small-amplitude signals are supplied to the input/output terminal a is similar to the described case. That is, in this case, the large-amplitude signals are transmitted from the input/output terminal b to the input/output terminal a via the two signal paths connected in parallel to each other. On the other hand, the small-amplitude signals are transmitted from the input/output terminal a to the input/output terminal b only via the signal path of the switch 1. In addition, in this case, the parasitic capacitance of the switching circuit 100 seen from the input/output terminal a corresponds to the parasitic capacitance attached to the node n1 of the switch 1 and the parasitic capacitance attached to the node n1 of the separation switch 3a. As a result, the deterioration of the small-amplitude signals can be suppressed.

In other words, when small-amplitude signals are transmitted, the parasitic capacitance of the switching circuit 100 seen from the input/output terminal a or b is mainly constituted by the parasitic capacitance included in the switch 1, and reduced by the amount corresponding to the parasitic capacitance of the switch 2.

In FIG. 1, resistors R are connected in series between the node n1 of the switch 2 and a ground voltage Vs, and between the node n2 of the switch 2 and the ground voltage Vs, respectively. This resistor R has a relatively large resistance value. Thus, a parasitic resistance may serve as the resistor R. This resistor R is provided for discharging electric charge accumulated in each of the nodes n1 and n2 of the switch 2 (i.e., the node n2 of the separation switch 3a and the node n1 of the separation switch 3b) when the switch 2 is, for example, in an off state, and for setting electric potentials of these nodes to the ground voltage Vs.

By the resistors R, the ground voltage Vs is applied to the node n2 of the separation switch 3a and the node n1 of the separation switch 3b even in a period in which each of the switches 1 and 2 turns off according to the control signals (first control signal and second control signal). As a result, even if the switches 1 and 2 are shut off (turned off), the separation switches (bidirectional diodes) 3a and 3b operate as electric potential barriers. In other words, unless a signal having an electric potential exceeding the ground voltage Vs by more than the electric potential barriers of the diodes is supplied to the input/output terminal a or b, the switch 2 is electrically separated (shut off) from the input/output terminals a or b.

In this manner, in the first embodiment, due to barriers voltage of the separation switches (bidirectional diodes) 3a and 3b, when signals with large amplitude and large current are transmitted (transmission period), the sum of the size of the switch 1 and the size of the switch 2 is appropriately designed. On the other hand, when small-amplitude signals are transmitted (reception period), the size of the switch 1 is appropriately designed. Through such control, the switch size can be optimized. In addition, in the period in which small-amplitude signals are transmitted, the parasitic capacitance of the switching circuit 100 is reduced, so that the deterioration of signals can be suppressed. Although the switches 1 and 2 and the separation switches 3a and 3b described herein are each formed by a semiconductor device and formed on a single semiconductor substrate, the configuration of these switches are not limited thereto.

In addition, in the example illustrated in FIG. 1, the description has been given of the case in which the voltage values of signals supplied to each of the input/output terminals a and b swing up and down (plus and minus) with a predetermined voltage being set to the center. Alternatively, signals supplied to each of the input/output terminals a and b may be signals having voltages that change only upward (plus) or downward (minus) with respect to a predetermined electric potential. In such a case, each of the separation switches 3a and 3b may not be a bidirectional diode but may be a unidirectional diode. For example, if the predetermined voltage is assumed to be the ground voltage Vs, and the signals are assumed to change only upward (plus) with respect to the ground voltage Vs, the configuration may be such that the separation switch 3a only includes the diode D11 (first diode) while the separation switch 3b only includes the diode D12 (second diode). With this configuration, in the transmission period in which large-amplitude signals are supplied to the input/output terminal a, two signal paths are formed in parallel between the input/output terminals a and b. In addition, when small-amplitude signals are supplied to the input/output terminal b, the node n1 of the switch 2 and the input/output terminal b are electrically separated from each other by the diode D12. The deterioration of the signals can be therefore suppressed.

Second Embodiment

Figure 2:
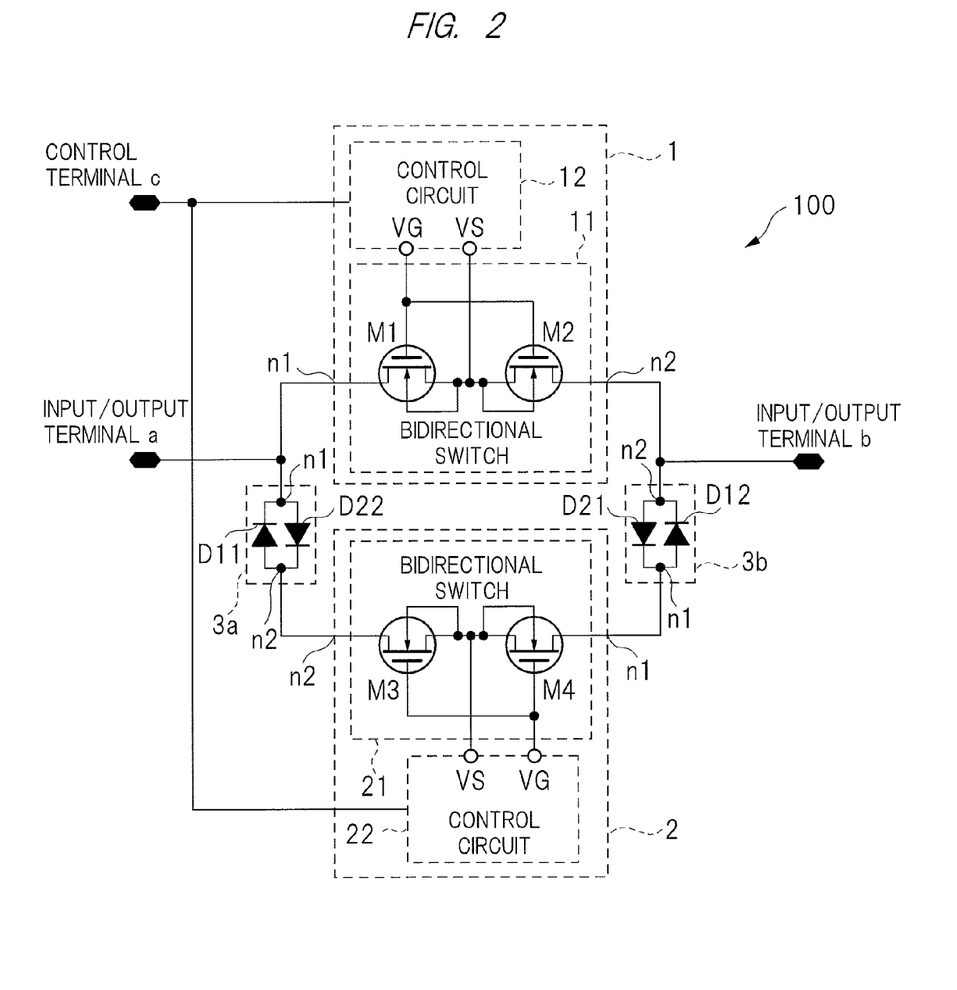
FIG. 2 is a circuit diagram illustrating a configuration of a switching circuit according to a second embodiment.

FIG. 2 is a circuit diagram illustrating a configuration of a switching circuit according to a second embodiment. A switching circuit 100 illustrated in FIG. 2 is similar to the switching circuit illustrated in FIG. 1. Thus, only differences will be described in the present embodiment. Although the resistors R illustrated in FIG. 1 are omitted in FIG. 2, the resistors R are assumed to be respectively connected to the nodes n1 and n2 of the switch 2 in a similar manner to FIG. 1.

In contrast to the first embodiment, in the second embodiment, each of the switches 1 and 2 includes a bidirectional switch and a control circuit. A bidirectional switch (first bidirectional switch) included in the switch 1 and a bidirectional switch (second bidirectional switch) included in the switch 2 are configured in a similar manner to each other. Similarly, a control circuit (first control circuit) included in the switch 1 and a control circuit (second control circuit) included in the switch 2 are configured in a similar manner to each other.

In FIG. 2, the switch 1 includes a bidirectional switch 11 and a control circuit 12. The bidirectional switch 11 includes first and second field-effect transistors (hereinafter, referred to as MOSFET) M1 and M2. In the second embodiment, the first and the second MOSFETs M1 and M2 are each assumed to be a high-voltage n channel-type MOSFET (hereinafter, referred to as a high-voltage n-type MOSFET). The high-voltage n-type MOSFETs described in the specification of the present application each includes a gate terminal, a source terminal, a drain terminal, and a body terminal (back gate terminal).

The respective source terminals and the body terminals of the first and the second high-voltage n-type MOSFETs M1 and M2 are connected in common, and connected to a control terminal VS of the control circuit 12. In addition, the respective gate terminals of the first and the second high-voltage n-type MOSFETs M1 and M2 are connected to a control terminal VG of the control circuit 12. Furthermore, the drain terminal of the first high-voltage n-type MOSFET M1 is connected to the input/output terminal a via the node n1 of the switch 1 while the drain terminal of the second high-voltage n-type MOSFET M2 is connected to the input/output terminal b via the node n2 of the switch 1.

Similarly, the switch 2 includes a bidirectional switch 21 and a control circuit 22. The bidirectional switch 21 includes third and fourth high-voltage n-type MOSFETs M3 and M4. The respective source terminals and the body terminals of the third and the fourth high-voltage n-type MOSFETs M3 and M4 are connected in common to each other, and connected to a control terminal VS of the control circuit 22. The respective gate terminals of the third and the fourth high-voltage n-type MOSFETs M3 and M4 are connected to a control terminal VG of the control circuit 22. The drain terminal of the third high-voltage n-type MOSFET M3 is connected to the node n2 of the separation switch (bidirectional diode) 3a via the node n2 of the switch 2 while the drain terminal of the fourth high-voltage n-type MOSFET M4 is connected to the node n1 of the separation switch (bidirectional diode) 3b via the node n1 of the switch 2.

The control circuits 12 and 22 generate, based on a control signal from the control terminal c and with reference to the electric potentials of the control terminals VS, voltages necessary for turning on/off the respective high-voltage n-type MOSFETs M1 to M4, as control signals, and supply the generated voltages to the control terminals VG. For example, electric potentials of the sources of the high-voltage n-type MOSFETs M1 to M4 vary between when large-amplitude signals are supplied to the input/output terminal a and when small-amplitude signals are supplied to the input/output terminal b. Thus, each of the control circuits 12 and 22 according to the second embodiment generates voltage for turning on/off the high-voltage n-type MOSFET, with reference to the electric potential of the control terminal VS that is obtainable at a corresponding moment, and outputs the generated voltage from the control terminal VG. For example, each of the control circuits 12 and 22 includes a capacitive element connected to the control terminal VS, and identifies the electric potential of the source terminal based on the electric charge accumulated in the capacitive element. Then, each of the control circuits 12 and 22 generates a control signal according to the electric potential of the source terminal that is identified at that time, and supplies the generated control signal to the control terminal VG. Here, while the source terminal and the drain terminal of the high-voltage n-type MOSFET are interchangeable with each other, in the specification of the present application, a terminal of the MOSFET that is connected to the body terminal is assumed to be the source terminal.

If the control circuits 12 and 22 generate, based on the control signal from the control terminal c, control signals applied to the control terminal VG, whose voltages are higher than the control terminals VS by ture-on voltage of M1 and M2, each of the high-voltage n-type MOSFETs M1 and M2 included in the bidirectional switch 11 turns on, and each of the high-voltage n-type MOSFETs M3 and M4 included in the bidirectional switch 21 also turns on. At this time, if large-amplitude signals are supplied to the input/output terminal a or b, as described in the first embodiment, the large-amplitude signals are transmitted to the input/output terminal b or a via the two switches 1 and 2. In other words, the large-amplitude signals are transmitted via the on-state high-voltage n-type MOSFETs M1 and M2 (M3 and M4). On the other hand, if small-amplitude signals are supplied to the input/output terminal b or a when the high-voltage n-type MOSFETs M1 to M4 are in the on state, in a similar manner to the first embodiment, the signals are transmitted only via the high-voltage n-type MOSFETs M1 and M2 included in the switch 1. Even when the high-voltage n-type MOSFETs M1 to M4 are in the off state, a parasitic capacitance is reduced, so that signal deterioration is suppressed, similarly to when the switch 2 is in the off state in the first embodiment.

In the second embodiment, the description has been given of the example in which the high-voltage n-type MOSFETs are used as the switches 1 and 2. Alternatively, the high-voltage n-type MOSFETs may be, for example, high-voltage p-type (p channel-type) MOSFETs, and can be replaced with devices having a similar function, such as a high-voltage bipolar transistor.

By using a semiconductor device formed on a single semiconductor substrate as a semiconductor device such as the high-voltage n-type MOSFETs M1 to M4, and the diodes D11, D12, D21, and D22, the switching circuit 100 described in the second embodiment is formed in a semiconductor integrated circuit. It is, however, not construed in a limiting sense.

Modified Example

Figure 3:
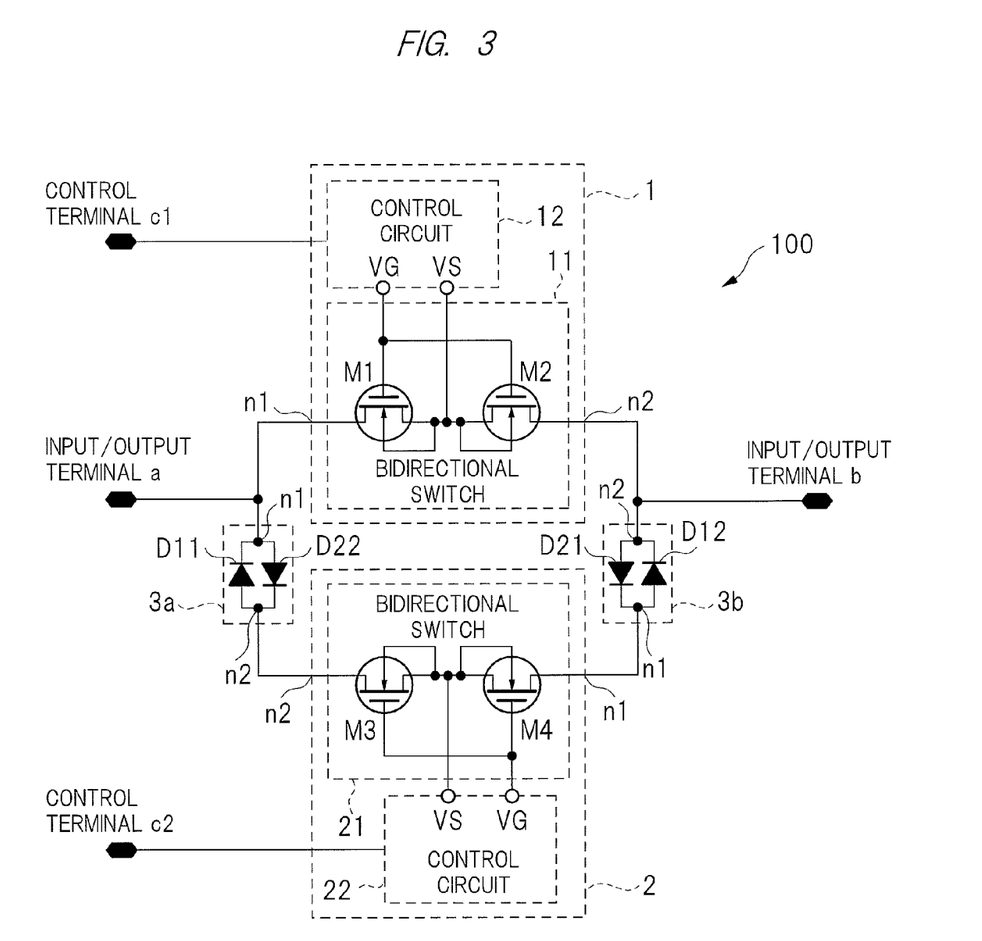
FIG. 3 is a circuit diagram illustrating a configuration of a switching circuit according to a modified example of the second embodiment.

FIG. 3 is a circuit diagram illustrating a configuration of a switching circuit according to a modified example of the second embodiment. The modified example illustrated in FIG. 3 is similar to the switching circuit illustrated in FIG. 2. Here, a difference will be mainly described.

The difference from the switching circuit illustrated in FIG. 2 lies in that a control signal supplied to the control circuit 12 included in the switch 1 differs from a control signal supplied to the control circuit 22 included in the switch 2. In other words, the on/off of the switches 1 and 2 is controlled by separate control signals. For supplying control signals different from each other, the switching circuit 100 includes control terminals c1 and c2 as control terminals. The control signal supplied to the control terminal c1 is supplied to the control circuit 12 as a control signal while the control signal supplied to the control terminal c2 is supplied to the control circuit 22 as a control signal.

Although the switch 2 performs an on/off operation in synchronization with the switch 1 in each of the switching circuits 100 illustrated in FIGS. 1 and 2, in this modified example, the on/off of the switches 1 and 2 can be individually controlled.

Third Embodiment

Figure 4:
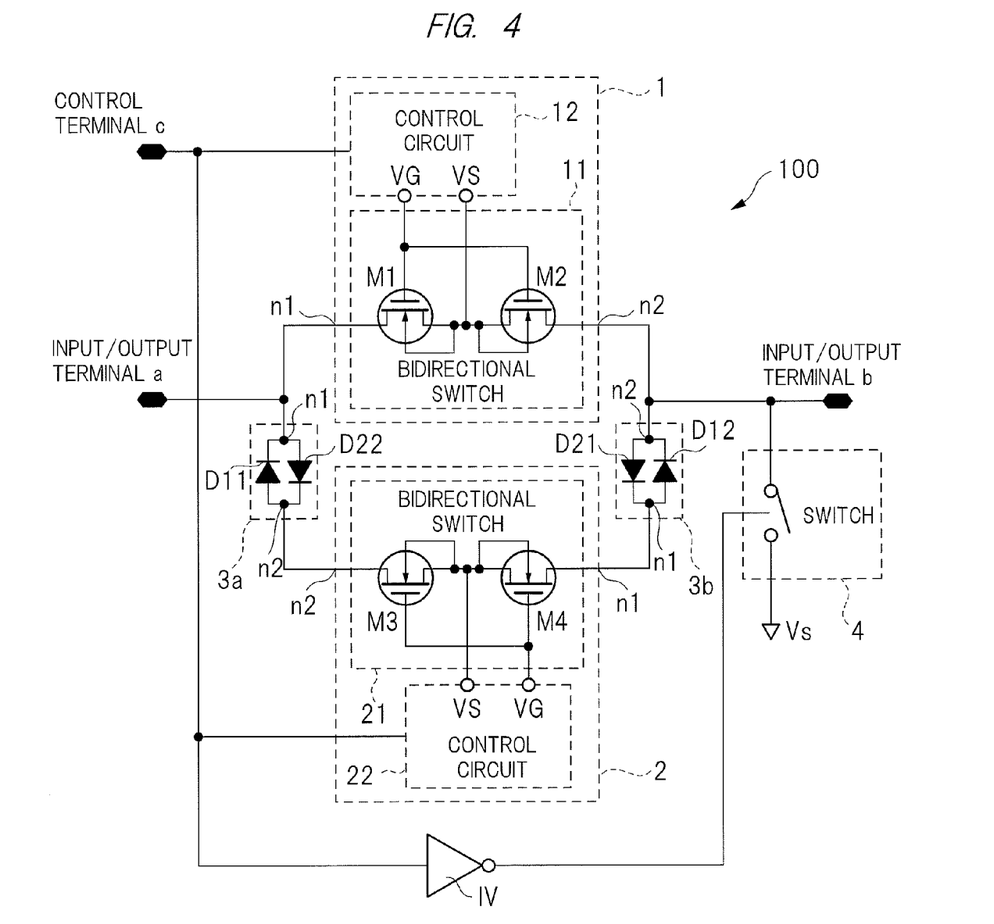
FIG. 4 is a circuit diagram illustrating a configuration of a switching circuit according to a third embodiment.

FIG. 4 is a circuit diagram illustrating a configuration of a switching circuit according to a third embodiment. A switching circuit 100 illustrated in FIG. 4 is similar to the switching circuit illustrated in FIG. 2. Here, as well, differences from the switching circuit illustrated in FIG. 2 will be mainly described.

The differences from the switching circuit illustrated in FIG. 2 lie in that the switching circuit 100 according to the third embodiment is provided with a switch 4 connected between the input/output terminal b and the ground voltage Vs, and an inverter circuit IV for controlling the switch 4. The inverter circuit IV inverses the phase of a control signal from the control terminal c, and supplies the control signal obtained through the phase inversion, as a control signal for turning on/off the switch 4.

In the third embodiment, the switch 4 is controlled to turn on/off (conduction/shutoff) in a complementary manner to the switches 1 and 2, according the control signal from the inverter circuit IV. More specifically, if the high-voltage n-type MOSFETs M1 and M2 included in the bidirectional switch 11 within the switch 1 turn on and the high-voltage n-type MOSFETs M3 and M4 included in the bidirectional switch 21 within the switch 2 turn on, according to the control signal from the control terminal c, the switch 4 turns off. In contrast, if each of the high-voltage n-type MOSFETs M1 to M4 turns off according to the control signal from the control terminal c, the switch 4 turns on. If the switch 4 turns on, the ground voltage Vs is supplied to the input/output terminal b via the switch 4.

In the third embodiment, drive signals for driving transducer elements are supplied to the input/output terminal a from a transmission/reception circuit (not illustrated). On the other hand, the transducer elements (not illustrated) are connected to the input/output terminal b. An example of the transmission/reception circuit and the transducer elements in a medical ultrasound imaging system will be described later with reference to FIG. 5.

If the switches 1 and 2 turn off (shutoff) according to the control signal from the control terminal c, it is desirable that the drive signals from the transmission/reception circuit connected to the input/output terminal a are not transmitted to (shut off from) the input/output terminal b. In other words, excellent off isolation is desired. If, however, each of the bidirectional switches 11 and 21 within the switches 1 and 2 is formed by the high-voltage n-type MOSFETs, a parasitic capacitance exists between terminals of each of the high-voltage n-type MOSFETs. Even if the high-voltage n-type MOSFET is in the off state, signals supplied to the input/output terminal have a leak to the input/output terminal b via this parasitic capacitance. Examples of the parasitic capacitance existing in the high-voltage n-type MOSFET include a parasitic capacitance existing between the source terminal and the gate terminal thereof, a parasitic capacitance existing between the drain terminal and the gate terminal thereof, and a parasitic capacitance existing between the drain terminal and the body terminal thereof.

Even if the high-voltage n-type MOSFETs M1 and M2 included in the bidirectional switch 11 are both in the off state, the parasitic capacitance existing in the high-voltage n-type MOSFET M1 and the parasitic capacitance existing in the high-voltage n-type MOSFET M2 are connected in series between the input/output terminals a and b, and signals in the input/output terminal a are transmitted as leakage signals to the input/output terminal b via these parasitic capacitances.

In addition, even if the high-voltage n-type MOSFETs M3 and M4 included in the bidirectional switch 21 are both in the off state, the parasitic capacitance existing in the high-voltage n-type MOSFET M3 and the parasitic capacitance existing in the high-voltage n-type MOSFET M4 are connected in series between the nodes n2 and n1 of the switch 2, and signals in the node n2 are transmitted as leakage signals to the node n1 via these parasitic capacitances. Also in each of the diodes D11, D12, D21 and D22, since a parasitic capacitance exists between the anode and the cathode, drive signals supplied to the input/output terminal a leak to the node n2 of the switch 2. Moreover, leakage signals in the node n1 of the switch 2 are introduced as leakage signals to the input/output terminal b.

In the third embodiment, when the switches 1 and 2 are in the off (shutoff) state, the switch 4 is in the on (conductive) state. As a result, leakage signals introduced to the input/output terminal b are absorbed into the ground voltage Vs, so that off isolation can be improved.

In the present embodiment, the high-voltage n-type MOS-FETs have been described as an example. Alternatively, the present invention can also be applied to a switching circuit using high-voltage p-type MOSFETs. In addition, also in FIGS. 3 and 4, the resistors R illustrated in FIG. 1 are omitted, but similarly to FIG. 2, the resistors Rare assumed to be provided.

Fourth Embodiment

Figure 5:
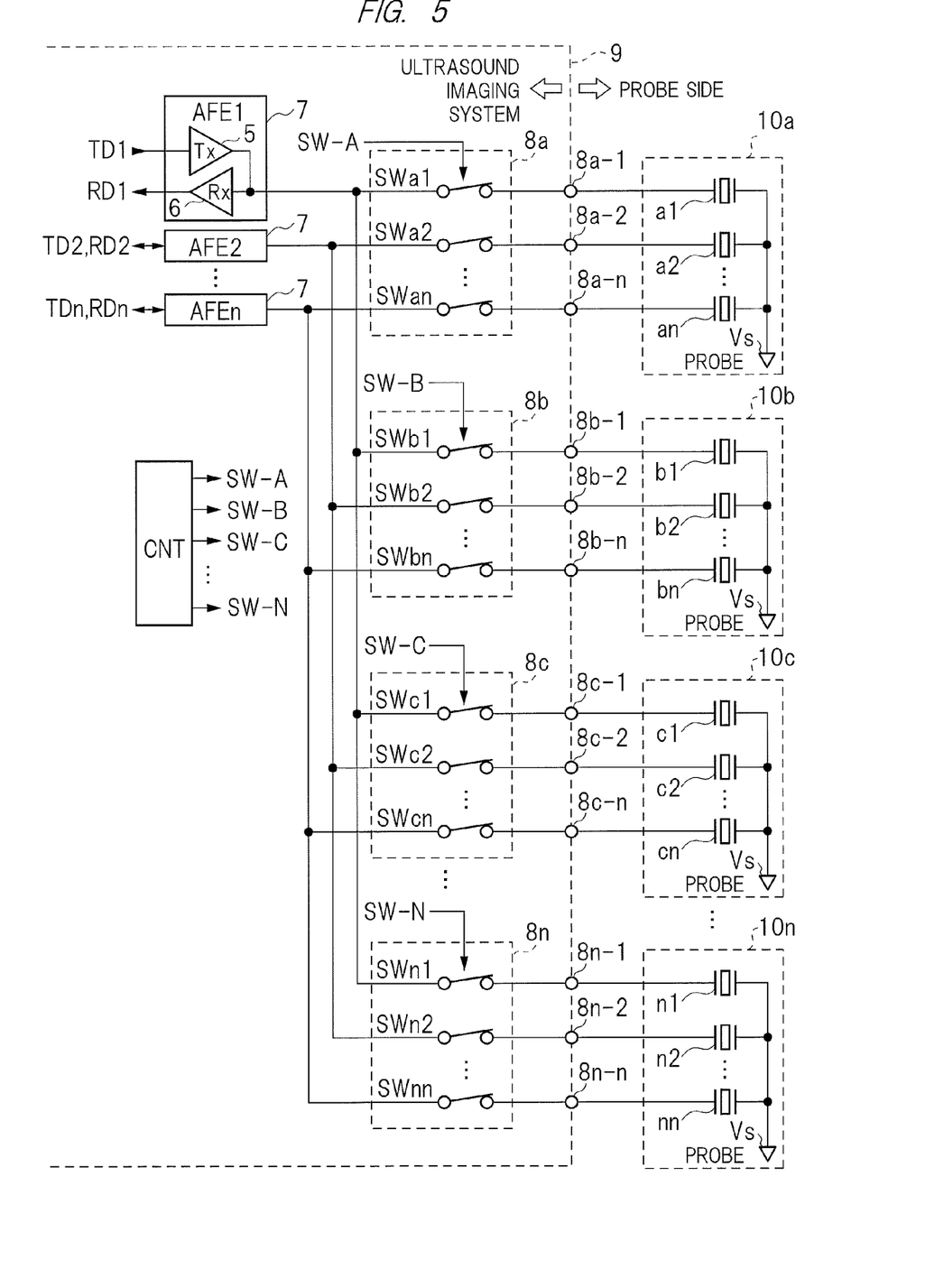
FIG. 5 is a block diagram illustrating a configuration of a medical ultrasound imaging system according to a fourth embodiment.

FIG. 5 is a block diagram illustrating a configuration of an ultrasound imaging system according to a fourth embodiment. In the present embodiment, an ultrasound imaging system using the switching circuit 100 described in the first to the third embodiments will be described.

FIG. 5 illustrates an ultrasound imaging system 9 and a plurality of probes 10a to 10n connected to the ultrasound imaging system 9 via cables. In FIG. 5, the probes 10a to 10n are provided on a probe side. Actually, the probes 10a to 10n are brought into contact with a human body. The probes 10a to 10n each include a plurality of transducer elements, i.e., include transducer elements a1 to an, b1 to bn, c1 to cn, and n1 to nn, respectively. Although the probes 10a to 10n are configured in a similar manner to each other, for example, the frequency of ultrasonic waves generated by the transducer elements differs by each probe. As the configurations of the probes are the same, the configurations will be described based on the probe 10a as a representative. The probe 10a includes the transducer elements a1 to an each including a pair of terminals. One terminals of the respective transducer elements a1 to an are connected via the cables to input/output terminals 8a-1 to 8a-n of the ultrasound imaging system 9. The other one terminals of the respective transducer elements a1 to an are connected to the ground voltage Vs. Drive signals with large amplitude and large current are supplied from the input/output terminals 8a-1 to 8a-n of the ultrasound imaging system 9 to the one terminals of the respective transducer elements a1 to an. In this case, the amplitudes of the drive signals increase or decrease with respect to the ground voltage Vs.

Based on the supplied drive signal, the transducer elements a1 to an generate ultrasonic waves. In addition, the transducer elements a1 to an convert, into electric signals, reflective waves of the generated ultrasonic waves that are reflected from inside of the body, and supply the electric signals to the input/output terminals 8a-1 to 8a-n of the ultrasound imaging system 9. Similarly to the probe 10a, the remaining probes 10b, 10c, and 10n each generate ultrasonic waves based on drive signals from the corresponding input/output terminals 8b-1 to 8b-n, 8c-1 to 8c-n, and 8n-1 to 8n-n of the ultrasound imaging system 9. In addition, the respective transducer elements convert, into electric signals, reflective waves obtained in response to the generated ultrasonic waves, and supply the electric signals to the corresponding input/output terminals 8b-1 to 8b-n, 8c-1 to 8c-n, and 8n-1 to 8n-n.

The ultrasound imaging system 9 includes, for example, a plurality of semiconductor integrated circuit. FIG. 5, however, only illustrates parts related to the input/output terminals 8a-1 to 8a-n, 8b-1 to 8b-n, 8c-1 to 8c-n, and 8n-1 to 8n-n. The ultrasound imaging system 9 illustrated in FIG. 5 includes semiconductor integrated circuit 8a to 8n for high-voltage switches, analog front-end circuits 7, and a control circuit CNT that controls the semiconductor integrated circuit 8a to 8n for high-voltage switches.

The semiconductor integrated circuit 8a to 8n for high-voltage switches are configured in a similar manner to each other though the configuration of each semiconductor integrated circuit is not especially limited. The semiconductor integrated circuit 8a to 8n for high-voltage switches each include a plurality of high-voltage switching circuits 100 described in the first to the third embodiments. The semiconductor integrated circuit 8a will be described as a representative. The semiconductor integrated circuit 8a includes high-voltage switching circuits SWa1 to SWan. Each of these high-voltage switching circuits SWa1 to SWan has the configuration of the switching circuit 100 described in the first to the third embodiments. In addition, these high-voltage switching circuits SWa1 to SWan are formed on a single semiconductor substrate to forma single semiconductor integrated circuit. Similarly to the semiconductor integrated circuit 8a, the remaining semiconductor integrated circuit 8b to 8n respectively include high-voltage switching circuits SWb1 to SWbn, SWc1 to SWcn, and SWn1 to SWnn. Each high-voltage switching circuit has the same configuration as that of the switching circuit 100 described in the first to the third embodiments.

The on/off of the high-voltage switching circuits included in each of the semiconductor integrated circuit 8a to 8n is controlled by the control circuit CNT. Though the present invention is not especially limited to the following, in the fourth embodiment, the control circuit CNT generates control signals SW-A to SW-N according to a user instruction, and supplies the generated control signals to the respective semiconductor integrated circuit 8a to 8n. In the fourth embodiment, the control signal SW-A is supplied to the semiconductor integrated circuit 8a, and is used as a control signal for turning on/off the high-voltage switching circuits SWa1 to SWan. In other words, the on/off of the high-voltage switching circuits SWa1 to SWan is controlled according to the control signal SW-A. In the fourth embodiment, all of the high-voltage switching circuits SWa1 to SWan are controlled to turn on/off at the substantially same time, according to the control signal SW-A.

In a similar manner to the semiconductor integrated circuit 8a, the control signals SW-B to SW-N are respectively supplied to the remaining semiconductor integrated circuit 8b to 8n. As a result, the high-voltage switching circuits SWb1 to SWbn in the semiconductor integrated circuit 8b are controlled to turn on/off at the substantially same time, according to the control signal SW-B. The high-voltage switching circuits SWc1 to SWcn in the semiconductor integrated circuit 8c are controlled to turn on/off at the substantially same time, according to a control signal SW-C. The high-voltage switching circuits SWn1 to SWnn in the semiconductor integrated circuit 8n are controlled to turn on/off at the substantially same time, according to the control signal SW-N.

As illustrated in FIG. 5, the plurality of analog front-end circuits 7 is provided. In the fourth embodiment, analog front-end circuits 7 (AFE1 to AFEn) are provided in the ultrasound imaging system 9. The number of the analog front-end circuits 7 (AFE1 to AFEn) corresponds to the number of high-voltage analog switching circuits (for example, SWa1 to SWan) included in each of the semiconductor integrated circuit 8a to 8n. The plurality of analog front-end circuits 7 (AFE1 to AFEn) respectively corresponds to high-voltage analog switching circuits included in each of the semiconductor integrated circuit 8a to 8n, on a one-to-one basis. Each of the plurality of analog front-end circuits 7 supplies drive signals to corresponding high-voltage analog switching circuits in the transmission period, and receives small-amplitude signals from the corresponding high-voltage analog switching circuits in the reception period.

Among the plurality of analog front-end circuits 7 (AFE1 to AFEn), the analog front-end circuit 7 (AFE1) will be described as a representative. This analog front-end circuit (AFE1) corresponds to the high-voltage analog switching circuits SWa1, SWb1, SWc1, and SWn1. The analog front-end circuit 7 (AFE1) supplies drive signals to these high-voltage analog switching circuits in the transmission period, and receives small-amplitude signals from these high-voltage analog switching circuits in the reception period. When the description is given of the relation to the first to the third embodiments, the analog front-end circuits 7 correspond to the transmission/reception circuit described in the first to the third embodiments.

Since the analog front-end circuits 7 (AFE1 to AFEn) are configured in a similar manner to each other, FIG. 5 illustrates the detailed configuration of the analog front-end circuit 7 (AFE1) only. The configurations of the analog front-end circuits 7 will be described based on the analog front-end circuit 7 (AFE1) as a representative. The analog front-end circuit 7 (transmission/reception circuit) includes a transmission drive circuit 5 (Tx) and a reception processing circuit 6 (Rx). When ultrasonic waves are generated in any of the probes 10a to 10n from a circuit block (not illustrated) within the ultrasound imaging system 9, the transmission drive circuit 5 receives a drive signal TD1, and supplies a large-amplitude drive signal to each of the semiconductor integrated circuit 8a to 8n. In addition, the reception processing circuit 6, for example, amplifies a small-amplitude signal supplied from any of the semiconductor integrated circuit 8a to 8n, and supplies the amplified signal to a circuit block (not illustrated) within the ultrasound imaging system 9 as a received signal RD1. In other words, in the transmission period, the analog front-end circuit 7 supplies a large-amplitude drive signal corresponding to the drive signal TD1 to each semiconductor integrated circuit, and in the reception period, the analog front-end circuit 7 receives a small-amplitude signal from a semiconductor integrated circuit and outputs the received signal RD1 corresponding to the received small-amplitude signal.

Similarly, the remaining analog front-end circuits 7 (AFE2 to AFEn) supply, in the transmission period, large-amplitude drive signals corresponding to drive signals TD2 to TDn to the respective semiconductor integrated circuit 8a to 8n, and output, in the reception period, received signals RD2 to RDn corresponding to small-amplitude signals from semiconductor integrated circuit. In the ultrasound imaging system, a circuit block (not illustrated) processes the received signals RD1 to RDn as signals according to reflective waves obtained in response to ultrasonic waves generated by transducer elements. Then, data such as an image is generated, and the generated data is displayed as an image for diagnosis.

Though the present invention is not especially limited to the following, in FIG. 5, the transmission drive circuit 5 is controlled to operate in the transmission period, and the reception processing circuit 6 is controlled to operate in the reception period.

Drive signals supplied from the analog front-end circuit 7 (AFE1) are applied to one input/output terminals of the corresponding high-voltage analog switching circuits SWa1, SWb1, SWc1, and SWn1 in the respective semiconductor integrated circuit 8a to 8n. For example, the input/output terminal a described in the first to the third embodiments is assumed to be one input/output terminals, and the drive signals from the analog front-end circuit 7 (AFE1) are applied to the input/output terminal a. In addition, small-amplitude signals from one input/output terminals of the respective high-voltage analog switching circuits SWa1, SWb1, SWc1, and SWn1 are applied to the analog front-end circuit 7 (AFE1). In other words, the input/output terminal of the analog front-end circuit 7 (AFE1) and one input/output terminal a of each of the high-voltage analog switching circuits SWa1, SWb1, SWc1, and SWn1 that correspond to this analog front-end circuit are electrically connected to each other.

Similarly, the input/output terminal of the analog front-end circuit 7 (AFE2) is connected to one input/output terminal a of each of the corresponding high-voltage analog switching circuits SWa2, SWb2, SWc2, and SWn2 in the respective semiconductor integrated circuit 8a to 8n. In addition, the input/output terminal of the analog front-end circuit 7 (AFEn) is connected to one input/output terminal a of each of the corresponding high-voltage analog switching circuits SWan, SWbn, SWcn, and SWnn in the respective semiconductor integrated circuit 8a to 8n.

In the fourth embodiment, the semiconductor integrated circuit 8a to 8n correspond to the probes 10a to 10n on a one-to-one basis. Taking the semiconductor integrated circuit 8a as an example, the semiconductor integrated circuit 8a corresponds to the probe 10a. Drive signals are supplied from the semiconductor integrated circuit 8a to the transducer elements a1~an inside probe 10a. Furthermore, small-amplitude signals received from the probe 10a are supplied to the semiconductor integrated circuit 8a. The remaining semiconductor integrated circuit 8b to 8n respectively correspond to the probes 10b to 10n on a one-to-one basis, and supply drive signals to the corresponding probes during transmission period and receive small-amplitude signals from the corresponding probes during reception period.

The other one input/output terminals of high-voltage analog switches in each of the semiconductor integrated circuit 8a to 8n are connected to a corresponding probe via the input/output terminal of the ultrasound imaging system 9. Taking the semiconductor integrated circuit 8a as an example. The other one input/output terminals of the respective high-voltage analog switching circuits SWa1 to SWan are respectively connected to the transducer elements a1 to an in the corresponding probe 10a via the input/output terminals 8a-1 to 8a-n of the ultrasound imaging system 9.

In the remaining semiconductor integrated circuit 8b to 8n, the other one input/output terminals of the respective high-voltage analog switching circuits SWb1 to SWbn, SWc1 to SWcn, and SWn1 to SWnn are connected to the transducer elements b1 to bn, c1 to cn, and n1 to nn in the corresponding probes.

At this time, each of the high-voltage analog switching circuits SWa1 to SWan, SWb1 to SWbn, SWc1 to SWcn, and SWn1 to SWnn has the configuration of the switching circuit 100 described in the first to the third embodiments. Thus, the other one input/output terminals of the respective high-voltage analog switching circuits SWa1 to SWan, SWb1 to SWbn, SWc1 to SWcn, and SWn1 to SWnn correspond to the input/output terminal b of the switching circuit 100 described in the first to the third embodiments.

Though the present invention is not especially limited to the following, in the fourth embodiment, the probes 10a to 10n are appropriately selected and used for diagnosis. For this reason, the pluralities of transducer elements a1 to an, b1 to bn, c1 to cn, and n1 to nn in the plurality of respective probes 10a to 10n are connected to the common analog front-end circuit via the high-voltage analog switching circuits in the semiconductor integrated circuit 8a to 8n that respectively correspond to the probes. For example, the transducer element a1 in the probe 10a, the transducer element b1 in the probe 10b, the transducer element c1 in the probe 10c, and the transducer element n1 in the probe 10n are connected to the input/output terminal of the common analog front-end circuit 7 (AFE1) via the high-voltage analog switching circuits SWa1, SWb1, SWc1, and SWn1, respectively. The remaining transducer elements are similarly connected to the input/output terminals of the common analog front-end circuits 7 (AFE2 to AFEn).

According to an operation performed by a user of the ultrasound imaging system, the control signals SW-A to SW-N are output from the control circuit CNT. More specifically, if the user specifies an appropriate probe from among the probes 10a to 10n, the control circuit CNT outputs the control signals SW-A to SW-N such that a plurality of high-voltage analog switching circuits in a semiconductor integrated circuit (any one of 8a to 8n) corresponding to the specified probe turns into the on state. For example, if the user specifies the probe 10a, the control circuit CNT sets the control signal SW-A at a high level, and sets the remaining control signals SW-B to SW-N at a low level.

As a result, the high-voltage analog switching circuits SWa1 to SWan in the semiconductor integrated circuit 8a turn on, and all the remaining high-voltage analog switching circuits turn off.

Since the high-voltage analog switching circuits each have the configuration of the switching circuit described in the first to the third embodiments, in the transmission period, a large-amplitude drive signal output from the analog front-end circuit 7 (AFE1) is supplied to the transducer element a1 via two signal paths included in the high-voltage analog switching circuit SWa1. As a result, in the transmission period, a drive signal with amplitude larger than the ground voltage Vs is applied to the transducer element a1. Furthermore, large current can be supplied to the transducer element a1. At this time, in the remaining high-voltage analog switching circuits SWa2 to SWan included in the same semiconductor integrated circuit 8a, large-amplitude drive signals output from the analog front-end circuit 7 (AFE2 to AFEn) are respectively supplied to the transducer elements a2 to an each via two signal paths. As a result, when ultrasonic waves are generated (transmission period), not only large-amplitude drive signals can be transmitted to the transducer elements but also large current can be supplied thereto.

On the other hand, in the reception period in which reflective waves are received from inside of the body, signals supplied from the transducer elements a1 to an to the respective high-voltage analog switching circuits SWa1 to SWan are small amplitudes. Accordingly, the separation switches 3a and 3b (FIGS. 1 to 4) included in each of the high-voltage analog switching circuits SWa1 to SWan are brought into the shutoff state. As a result, parasitic capacitances attached to one input/output terminal a (FIGS. 1 to 4) and the other one input/output terminal b (FIGS. 1 to 4) of each of the high-voltage analog switching circuits SWa1 to SWan can be suppressed. Thus, the deterioration of signals supplied from the transducer elements a1 to an to the analog front-end circuits 7 via the semiconductor integrated circuit 8a can be suppressed, so that signals with less deterioration can be transmitted to the reception processing circuit 6.

When the high-voltage analog switching circuits in the semiconductor integrated circuit 8a are in the on state, each high-voltage analog switching circuit in the semiconductor integrated circuit 8b to 8n is in the off state. Even when a high-voltage analog switching circuit is in the off state, the separation switches 3a and 3b in the high-voltage analog switching circuit being in the off state are in the shutoff state. On the other hand, in the fourth embodiment, a plurality of semiconductor integrated circuit is connected to the input/output terminal of an analog front-end circuit.

For example, when the focus is placed on the analog front-end circuit 7 (AFE1), one input/output terminals of n high-voltage analog switching circuits SWa1, SWb1, SWc1, and SWn1 are connected to the input/output terminal of the analog front-end circuit 7 (AFE1). Thus, parasitic capacitances of the n high-voltage analog switching circuits are added to the input/output terminal of the analog front-end circuit 7 (AFE1). Nevertheless, among the n high-voltage analog switching circuits, only one high-voltage analog switching circuit turns to the conductive state, and (n−1) high-voltage analog switching circuits are in the shutoff state. In each of the high-voltage analog switching circuits being in the shutoff state, the separation switches 3a and 3b are in the shutoff state, and the switch 2 (FIGS. 1 to 4) is separated from the input/output terminals a and b (FIGS. 1 to 4).

Thus, even if the n high-voltage analog switching circuits are connected, the large increase of the parasitic capacitances added to the input/output terminal of the analog front-end circuit 7 (AFE1) can be suppressed. As a result, in the input/output terminal of the analog front-end circuit 7 (AFE1), the waveform deterioration of the received signal can be reduced. In addition, also in the transmission period, the increase of the parasitic capacitances added to the input/output terminal of the analog front-end circuit 7 (AFE1) is suppressed, so that the deterioration of drive signals in the input/output terminal can be suppressed. While the analog front-end circuit 7 (AFE1) has been described as an example, the same applies to the other analog front-end circuits.

The invention devised by the present inventor has been specifically described above based on the embodiments. The present invention is, however, not limited to the above-described embodiments. It should be appreciated that various modifications can be made without departing from the gist of the present invention. For example, in the fourth embodiment, a plurality of high-voltage analog switching circuits in a single semiconductor integrated circuit for a high-voltage switch is controlled to turn on/off at the substantially same time. Alternatively, each high-voltage analog switching circuit may be controlled to turn on/off individually. In other words, on/off control may be performed not on a probe basis, but on a high-voltage analog switching circuit basis.

REFERENCE SIGNS LIST 1, 2, 4 switch
3a, 3b separation switch
5 transmission drive circuit
6 reception processing circuit
7 analog front-end circuits
8a to 8n semiconductor integrated circuit
9 ultrasound imaging system
10a to 10n probe
11, 21 bidirectional switch
12, 22 control circuit
100 switching circuit

The invention claimed is:

1. A switching circuit, comprising:
a first terminal;
a second terminal;
a first switch having a first node connected to the first terminal and a second node connected to the second terminal, and configured to electrically connect the first node and the second node according to a control signal;
a second switch having a first node and a second node, and configured to electrically connect the first node and the second node in synchronization with the first switch;
a first separation switch having a first node connected to the first terminal and a second node connected to the second node of the second switch, and configured to transmit a signal in the first node to the second node when an electric potential of the first node is higher than an electric potential of the second node by a more than predetermined electric potential; and
a second separation switch having a first node and a second node, the second node being connected to the second terminal and the first node being connected to the first node of the second switch, and configured to transmit a signal in the first node to the second node when an electric potential of the first node is higher than an electric potential of the second node by more than a predetermined electric potential.

2. The switching circuit according to claim 1,
wherein the first separation switch has a first diode connected between the first node and the second node thereof, and the predetermined electric potential in the first separation switch is an electric potential barrier of the first diode, and
the second separation switch has a second diode connected between the first node and the second node thereof, and the predetermined electric potential in the second separation switch is an electric potential barrier of the second diode.

3. The switching circuit according to claim 2,
wherein the first separation switch has a third diode connected between the first node and the second node thereof, and transmits a signal in the second node of the first separation switch to the first node of the first separation switch when an electric potential of the second node of the first separation switch is higher than an electric potential of the first node of the first separation switch by more than the barrier voltage of the third diode,
the second separation switch has a fourth diode connected between the first node and the second node thereof, and transmits a signal in the second node of the second separation switch to the first node of the second separation switch when an electric potential of the second node of the second separation switch is higher than an electric potential of the first node of the second separation switch by more than the barrier voltage of the fourth diode,
the first separation switch and the second separation switch turn to a conductive state when a first input signal, which has amplitude larger than a signal supplied to the second terminal, is applied to the first terminal, and the first input signal is transmitted to the second terminal via the first switch and the second switch, and
each of the first separation switch and the second separation switch turns to a non-conductive state when a second input signal, which has amplitude smaller than the first input signal, is supplied to the second terminal, and the second switch is electrically separated from the first terminal and the second terminal.

4. The switching circuit according to claim 3,
wherein the first switch has a first bidirectional switch and a first control circuit that controls the first bidirectional switch according to the control signal,
the first bidirectional switch includes a first metal-oxide semiconductor field-effect transistor (MOSFET) and a second MOSFET each having a gate terminal, a source terminal, a drain terminal, and a body terminal, and the drain terminal of the first MOSFET is connected to the first terminal, a drain terminal of the second MOSFET is connected to the second terminal, and the respective source terminals and the body terminals of the first MOSFET and the second MOSFET are connected in common,
the first control circuit is connected to the respective source terminals of the first MOSFET and the second MOSFET that are connected in common, and to the respective gate terminals of the first MOSFET and the second MOSFET, and switches the first MOSFET and the second MOSFET according to the control signal,
the second switch consists of a second bidirectional switch and a second control circuit, and the second bidirectional switch includes a third MOSFET and a fourth MOSFET each having a gate terminal, a source terminal, a drain terminal, and a body terminal, and the drain terminal of the third MOSFET is connected to the second node of the first separation switch, a drain terminal of the fourth MOSFET is connected to the first node of the second separation switch, and the respective source terminals and the body terminals of the third MOSFET and the fourth MOSFET are connected in common, and
the second control circuit is connected to the respective source terminals of the third MOSFET and the fourth MOSFET that are connected in common, and to the respective gate terminals of the third MOSFET and the fourth MOSFET, and switches the third MOSFET and the fourth MOSFET in synchronization with the first MOSFET and the second MOSFET in the first bidirectional switch.

5. A switching circuit according to claim 4, realized as an integrated semiconductor circuit formed on a semiconductor substrate.

6. The switching circuit according to claim 3,
wherein the switching circuit has a third switch connected between the second terminal and a ground electric potential, and
the third switch is controlled to perform conduction in a complementary manner to the first switch and the second switch, and supplies a ground electric potential to the second terminal by conduction.

7. A switching circuit according to claim 6, realized as an integrated semiconductor circuit formed on a semiconductor substrate.

8. A switching circuit according to claim 3, realized as an integrated semiconductor circuit formed on a semiconductor substrate.

* * * * *